United States Patent
Park et al.

(10) Patent No.: US 7,342,271 B2
(45) Date of Patent: Mar. 11, 2008

(54) CMOS IMAGE SENSOR PROVIDING UNIFORM PIXEL EXPOSURE AND METHOD OF FABRICATING SAME

(75) Inventors: Young-Hoon Park, Suwon-si (KR); Tae-Seok Oh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 107 days.

(21) Appl. No.: 11/274,855

(22) Filed: Nov. 16, 2005

(65) Prior Publication Data

US 2006/0102938 A1  May 18, 2006

(30) Foreign Application Priority Data

Nov. 18, 2004  (KR) .................. 10-2004-0094704

(51) Int. Cl.
- H01L 27/148 (2006.01)
- H01L 19/768 (2006.01)
- H01L 31/062 (2006.01)
- H01L 31/113 (2006.01)

(52) U.S. Cl. ...................................... 257/292; 257/230
(58) Field of Classification Search ................ 257/292, 257/230
See application file for complete search history.

(56) References Cited

U.S. PATENT DOCUMENTS

| 6,486,503 B1 | 11/2002 | Fossum |  |
| 6,686,220 B2 * | 2/2004 | Rhodes et al. | 438/69 |
| 7,109,537 B2 * | 9/2006 | Dosluoglu et al. | 257/292 |
| 2004/0051801 A1 | 3/2004 | Iizuka et al. |  |
| 2006/0065915 A1 * | 3/2006 | Kuwazawa | 257/292 |
| 2006/0267053 A1 * | 11/2006 | Yang et al. | 257/291 |

FOREIGN PATENT DOCUMENTS

| JP | 2002-064751 | 2/2002 |
| JP | 2004-111590 | 4/2004 |

* cited by examiner

Primary Examiner—Van Thu Nguyen
Assistant Examiner—Allison P Bernstein
(74) Attorney, Agent, or Firm—Volentine & Whitt, PLLC (57) ABSTRACT

An CMOS image sensor includes a photodiode region generating electrical charges in response to incident light received thereat. In one example, the CMOS image sensor further includes first and second transfer gates adapted to prevent or substantially prevent the electrical charges from overflowing into a floating diffusion region or a storage diffusion region located on opposite sides of the photodiode region. In this example, a read diffusion region is formed in the semiconductor substrate on an opposite side of the storage diffusion region relative to the photodiode region and a reset diffusion region is formed in the semiconductor substrate on an opposite side of the floating diffusion region relative to the photodiode region. The read diffusion region may be electrically connected to the floating diffusion region by a connection line.

17 Claims, 10 Drawing Sheets

(Prior Art)

Single Frame Capture Mode
(30Lux, Integration Time=1/400sec@40C,VGA)

CMOS IMAGE SENSOR PROVIDING UNIFORM PIXEL EXPOSURE AND METHOD OF FABRICATING SAME

BACKGROUND

1. Field of the Invention

The present invention relates generally to a complementary metal oxide semiconductor (CMOS) image sensor and a method of fabricating the same. More particularly, the invention relates to a CMOS image sensor providing uniform pixel exposure by avoiding overflow of electrical charges from a photodiode region formed therein and a method of fabricating the same.

A claim of priority is made to Korean Patent Application 2004-94704 filed on Nov. 18, 2004, the disclosure of which is hereby incorporated by reference in its entirety.

2. Description of the Related Art

A wide array of consumer and industrial electronic devices incorporate image sensors. These devices include, for example, digital cameras, cellular phones, web cameras, personal digital assistants, and digital video cameras, to name but a few.

An image sensor converts light into electrical signals, which are then used to form an image. The light is generally supplied to the image sensor through a collection of optical components such as, for example, a lens. The electrical signals are then processed by a collection of electronic components including, for example, an amplifier, an analog to digital converter (ADC), etc., to produce the image.

The image typically comprises an array of pixels arranged in a matrix and each pixel generally comprises a set of discrete data values representing intensities and/or colors of light received by the image sensor.

Each pixel is generated by a corresponding pixel sensor located in a pixel sensor array in the image sensor. Each pixel sensor comprises a light detection unit (e.g., a photodetector), a transmission unit, and a signal output unit.

Image sensors may be broadly categorized in two classes, namely charge coupled device (CCD) image sensors and complementary metal oxide semiconductor (CMOS) image sensors. Both classes of image sensors are widely used and both have advantages over the other.

A CCD image sensor accumulates electrical charges in the photodetector of each pixel sensor and then transfers the electrical charges from each pixel sensor to a common output structure. The common output structure converts the electrical charges to voltages, buffers the voltages, and transfers the voltages to other electrical elements for processing.

In contrast to the CCD image sensor, a CMOS image sensor accumulates electrical charges in the photodetector of each pixel sensor, and then locally converts the electrical charges into voltages at each pixel sensor. Accordingly, each pixel sensor in a CMOS image sensor typically contains additional circuitry such as a buffer, an amplifier, and so forth. This difference has significant implications for CMOS image sensor architecture as well as capabilities and limitations of the CMOS image sensor.

Some advantages of using a CCD image sensor instead of a CMOS image sensor include a superior ability to arbitrarily start and stop exposure, i.e., electronic shuttering, a superior dynamic range, more uniform exposure of pixels under identical lighting conditions, and a lower susceptibility to noise caused by on chip circuitry.

On the other hand, some advantages of using a CMOS image sensor instead of the CCD image sensor include the fact that CMOS image sensors can be fabricated using general CMOS processing techniques. Using general CMOS processing techniques to fabricate the CMOS image sensor allows various electrical elements to be readily formed near each pixel sensor in the pixel sensor array. The electrical elements may include, for example, amplifiers, filters, buffers, and so forth. The electrical elements formed near each pixel sensor allow pixels to be transferred and/or processed by the pixel sensor much faster than in a CCD image sensor. Accordingly, higher frame rates can generally be obtained by CMOS image sensors. In addition, in CMOS image sensors, small regions of an image can be processed independent of other regions since each pixel sensor has the ability to locally convert electrical charges into voltages.

Another advantage of the CMOS image sensor is that it is more power efficient than the CCD image sensor. The CCD image sensor consumes a large amount of power because it uses an external control signal and large clock swing operations to control the transfer electrical charges.

One significant problem with CMOS image sensors, however, is that pixels tend to be non-uniformly exposed under identical lighting conditions. This is due, at least in part, to the architecture used in most CMOS image sensors and the way in which they operate. This is described in relation to FIGS. 1A, 1B and 2.

Figure 1A:
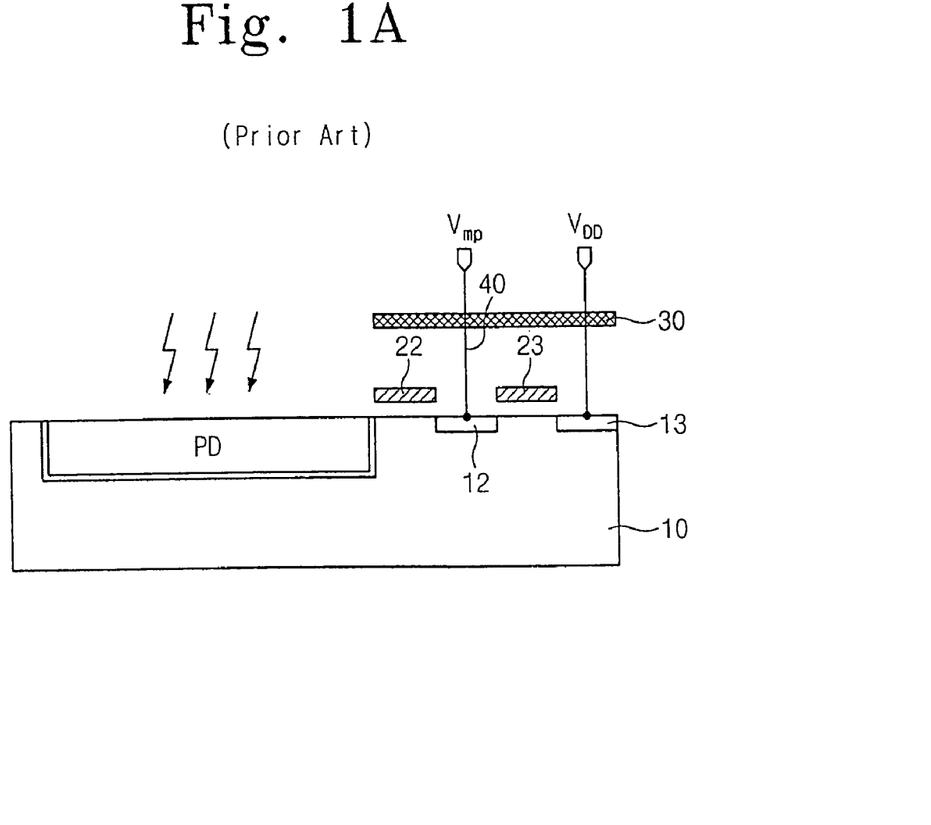
FIG. 1A is a diagram of a conventional CMOS image sensor.
Figure 1B:
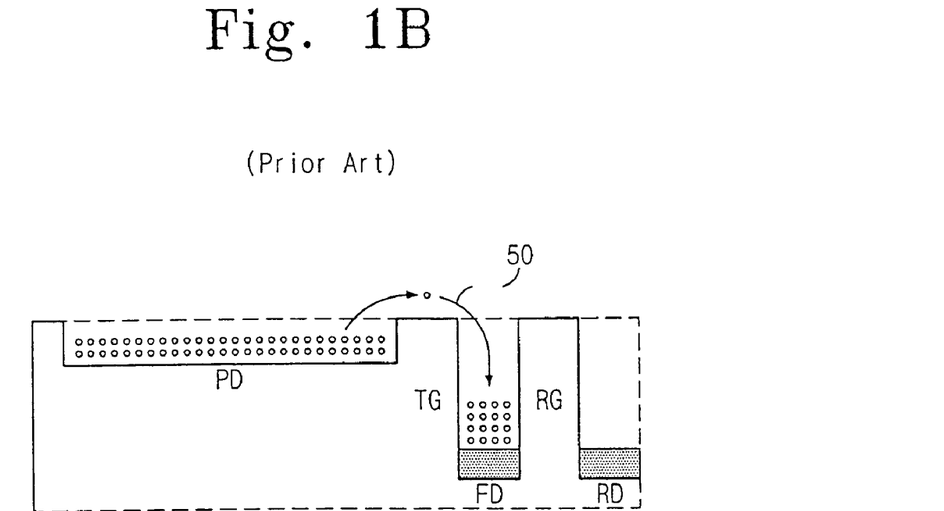
FIG. 1B is a diagram illustrating an overflow of electrons from a photodiode region in a conventional CMOS image sensor to a floating diffusion region of the conventional CMOS image sensor.

FIG. 1A is a diagram illustrating a pixel sensor in a conventional CMOS image sensor (CIS) and FIG. 1B is a diagram illustrating an overflow of electrons from one region of the pixel sensor to another during a read operation of the CIS.

Referring FIGS. 1A and 1B, a pixel sensor in a conventional CIS includes a photodiode region PD formed in a semiconductor substrate 10, a transfer gate (TG) 22, and a reset gate (RG) 23. A light shielding plate 30 is formed over transfer gate 22 and reset gate 23.

Incident light generates free electrical charges in photodiode region PD. Transfer gate 22 controls a transfer of the electrical charges from photodiode region PD to a floating diffusion (FD) region 12. Meanwhile, reset gate 23 controls a removal of the electrical charges from floating diffusion region 12. Floating diffusion region 12 is connected via a connection line 40 to the gate of a source follower transistor (not shown) which is adapted to detect a potential associated with the electrical charges accumulated in floating diffusion region 12.

Connection line 40 is formed by a method comprising forming an interlevel insulation film covering gates 22 and 23, patterning the interlevel insulation film to form a contact hole exposing floating diffusion region 12, and forming a contact plug to fill up the contact hole.

Unfortunately, floating diffusion region 12 is often damaged when the interlevel insulation film is patterned. Furthermore, the contact plug filling the contact hole often contaminates floating diffusion region 12 where the contact plug is formed of a metallic material. The damage and contamination caused to floating diffusion region 12 can lead to leakage current in the pixel sensor and white spots in pixels generated by the pixel sensor.

Because the conventional CIS is not equipped with a mechanical shutter, incident light is received by photodiode region PD while a read operation of the pixel sensor is performed. Accordingly, free electrical charges are continuously accumulated in photodiode region PD. Where the intensity of the incident light is high, charges accumulated at photodiode region PD overflow into floating diffusion region 12. The overflowing charges (50) increase the amount of charge accumulated in floating diffusion region 12. As a result, the brightness of a pixel corresponding to the pixel sensor increases as a time interval between when the pixel sensor is exposed and when it is read increases.

The operation of a CIS can be roughly divided into three basic operations: a reset operation for removing electrical charges accumulated in pixel sensors during a previous frame, an exposure operation for accumulating electrical charges in the pixel sensors, and a read operation for sensing potential variation caused by the accumulated electrical charges. Because the CIS is not able to read all of its pixel sensors at the same time, the read operation is performed for each pixel sensor according to a predetermined sequence.

Figure 2:
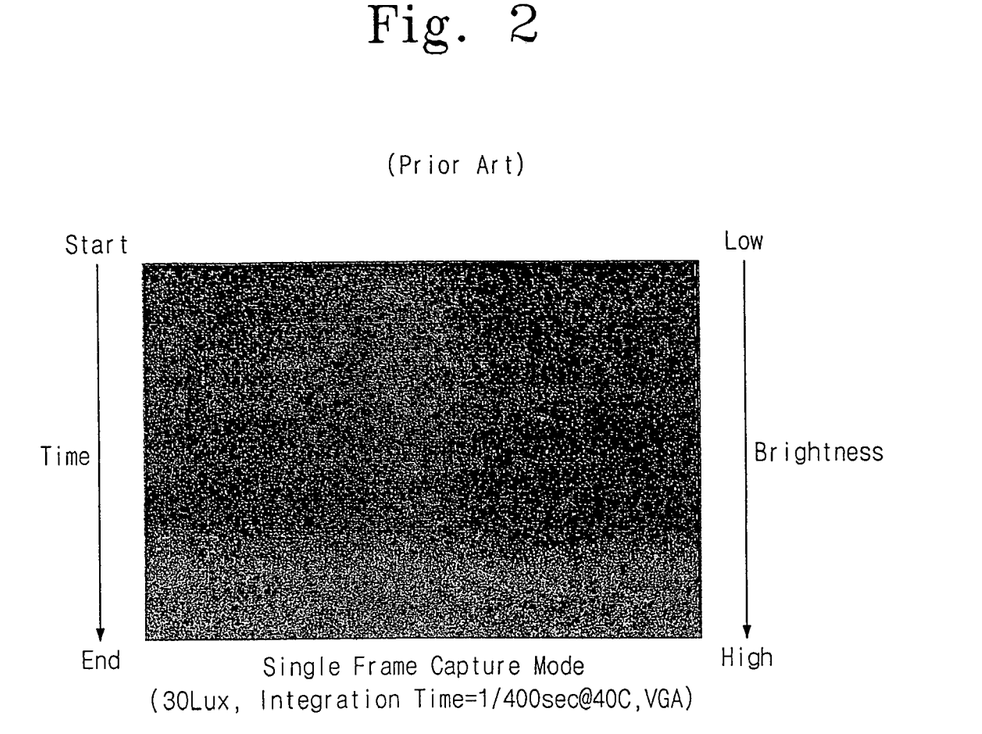
FIG. 2 is an image captured by a conventional CMOS image sensor.

FIG. 2 shows an image captured by a conventional CIS. In FIG. 2, image defects such as white spots caused by an overflow of charges from a photodiode region to a floating diffusion region are clearly visible.

Pixel sensors in the conventional CIS perform read operations in a predetermined sequence as described above. In FIG. 2, the read operations were performed in a raster scan order beginning at a top corner of the image. However, the pixel sensors perform the exposure operation at roughly the same time. Accordingly, a time lapse between the exposure operation and the read operation increases from the top of the image to the bottom.

Because the time lapse between the exposure operation and the read operation increases toward the bottom of the image, the intensity of pixels toward the bottom of the image tends to be brighter than the intensity of pixels at the top of the image. This is due to the previously discussed overflow of charges from the respective photodiode regions to the floating diffusion regions of the pixel sensors in the CIS.

In order to minimize image distortion caused by charges overflowing into the floating diffusion region, U.S. Pat. No. 5,986,297 proposes a method by which charges are accumulated in a metal oxide semiconductor (MOS) capacitor rather than floating diffusion region 12. Unfortunately, however, the MOS capacitor does not entirely prevent the overflow of charges from the photodiode region.

SUMMARY OF THE INVENTION

According to one embodiment of the invention, a complementary metal oxide semiconductor (CMOS) image sensor is provided. The CMOS image sensor comprises a photodiode region formed in a semiconductor substrate, a storage diffusion region formed in the semiconductor substrate on one side of the photodiode region, a reset diffusion region formed in the semiconductor substrate on another side of the photodiode region, a read diffusion region formed in the semiconductor substrate on an opposite side of the storage diffusion region relative to the photodiode region, and a floating diffusion region formed in the semiconductor substrate between the reset diffusion region and the photodiode region.

According to another embodiment of the present invention, a CMOS image sensor comprises a photodiode region formed in a semiconductor substrate, a storage diffusion region formed in the semiconductor substrate on a first side of the photodiode region, a floating diffusion region formed in the semiconductor substrate on a second side of the photodiode region, a read diffusion region formed in the semiconductor substrate on an opposite side of the storage diffusion region relative to the photodiode region, and a reset diffusion region formed in the semiconductor substrate on an opposite side of the floating diffusion region relative to the photodiode region. The CMOS image sensor further comprises an upper capacitor electrode formed over the storage diffusion region, a first transfer gate formed over the semiconductor substrate between the storage diffusion region and the photodiode region, a second transfer gate formed over the semiconductor substrate between the floating diffusion region and the photodiode region, a read gate formed over the semiconductor substrate between the read diffusion region and the storage diffusion region, and a reset gate formed over the semiconductor substrate between the reset diffusion region and the floating diffusion region.

According to still another embodiment of the invention, a method of fabricating a CMOS image sensor is provided. The method comprises forming field isolation film patterns defining active regions in a semiconductor substrate, forming a storage diffusion region in one of the active regions, and forming a first transfer gate, a second transfer gate, a read gate, and a reset gate on the semiconductor substrate. The method further comprises forming an upper capacitor electrode over the storage diffusion region, forming a photodiode region in an active region of the semiconductor substrate between the first and second transfer gates, forming a read diffusion region, a floating diffusion region, and a reset diffusion region in the semiconductor substrate using a mask covering the photodiode region and the storage diffusion region, and forming connection lines respectively contacting the first transfer gate, the second transfer gate, the read gate, the reset gate, the read diffusion region, the floating diffusion region, and the reset diffusion region. The connection line contacting the read diffusion region is connected to the connection line contacting the floating diffusion region.

Preferably, the second transfer gate is formed between the photodiode region and the floating diffusion region, the read gate is formed between the storage diffusion region and the read diffusion region, and the reset gate is formed between the floating diffusion region and the reset diffusion region.

BRIEF DESCRIPTION OF THE DRAWINGS

The invention is described below in relation to several embodiments illustrated in the accompanying drawings. Throughout the drawings like reference numbers indicate like exemplary elements, components, or steps and the thickness of layers and regions are exaggerated for clarity. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 3:
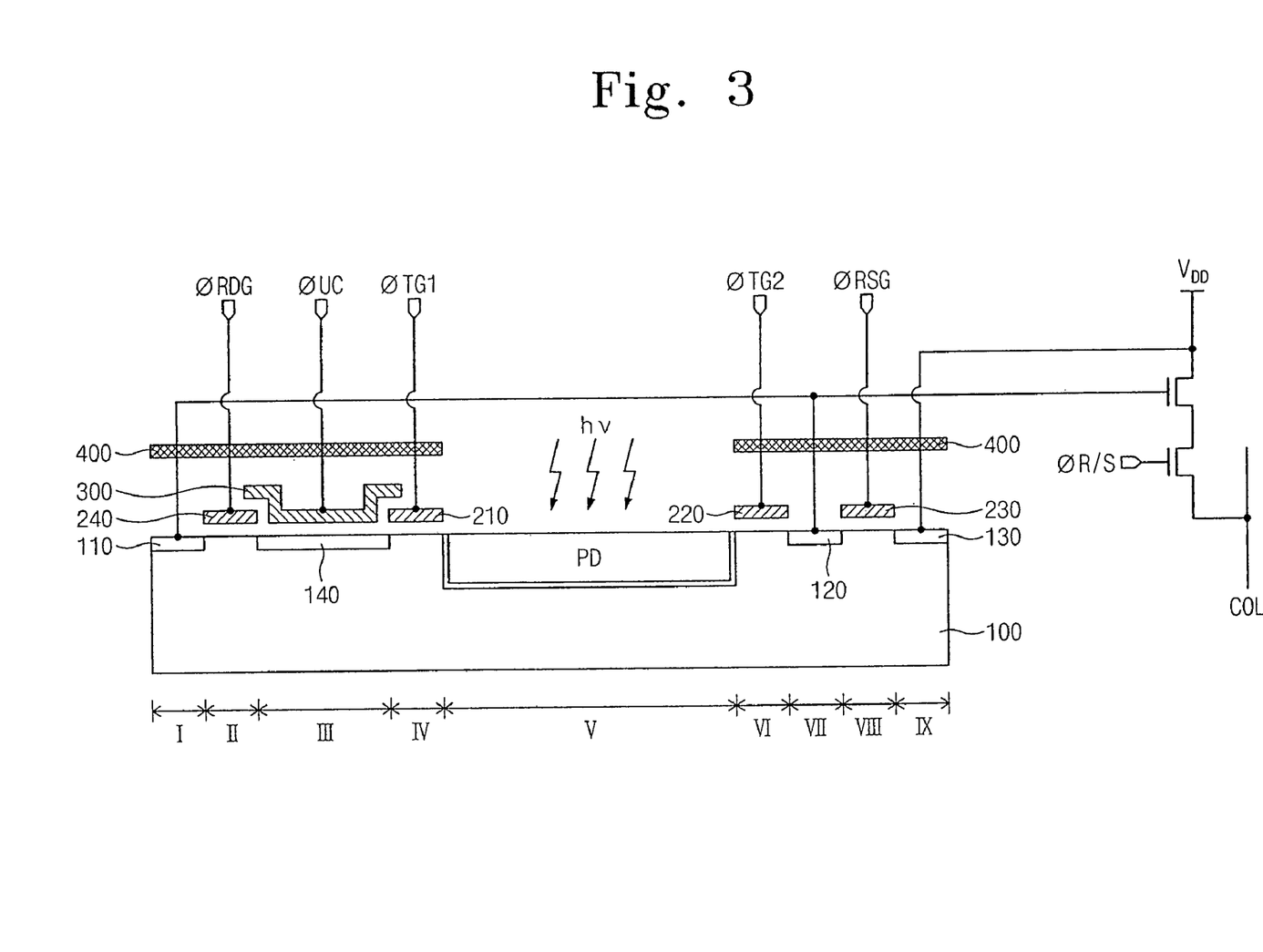
FIG. 3 is a diagram of a pixel sensor in a CMOS image sensor according to an embodiment of the present invention.

FIG. 3 is a diagram of a pixel sensor in a CMOS image sensor (CIS) according to one embodiment of the invention. The pixel sensor shown in FIG. 3 is one of a plurality of pixel sensors included in the CMOS image sensor.

Referring to FIG. 3, the pixel sensor comprises a plurality of field isolation patterns defining an active region in a predetermined region of a semiconductor substrate 100. The active region includes a photodiode region PD accumulating electrical charges in response to incident light received thereat. Photodiode region PD is preferably constructed of PN junction occupying as much area in the pixel sensor as possible.

A storage diffusion region 140 is formed on one side of photodiode region PD and a floating diffusion region 120 is formed on another side of photodiode region PD. A first transfer gate 210 is formed over the active region between storage diffusion region 140 and photodiode region PD to control a transfer of electrical charges from photodiode region PD to storage diffusion region 140. A voltage applied to first transfer gate 210 is controlled by a first transfer signal $\Phi TG1$.

A second transfer gate 220 is formed over the active region between floating diffusion region 120 and photodiode region PD to control a transfer of electrical charges from photodiode region PD to floating diffusion region 120. A voltage applied to second transfer gate 220 is controlled by a second transfer signal $\Phi TG2$.

An upper capacitor electrode 300 is formed over storage diffusion region 140 to control a potential of storage diffusion region 140. A voltage applied to upper capacitor electrode 300 is controlled by an upper electrode signal $\Phi UC$. Upper capacitor electrode 300 forms part of a metal oxide semiconductor (MOS) capacitor on one side of photodiode region PD.

A reset diffusion region 130 is formed in semiconductor substrate 100 on an opposite side of floating diffusion region 120 relative to photodiode region PD. A reset gate 230 is formed over the semiconductor substrate between storage diffusion region 120 and reset diffusion region 130. Reset gate 230 controls opening and closing of a reset channel connecting floating diffusion region 120 and reset diffusion region 130. A voltage applied to the reset gate 230 is controlled by a reset signal $\Phi RSG$ and a power source voltage VDD is applied to reset diffusion region 130.

A read diffusion region 110 is formed in semiconductor substrate 100 on an opposite side of storage diffusion region 140 relative to photodiode region PD. A read gate 240 is arranged over semiconductor substrate 100 between storage diffusion region 140 and read diffusion region 110. Read gate 240 controls opening and closing of a read channel connecting storage diffusion region 140 and read diffusion region 110. A voltage applied to read gate 240 is controlled by a reading signal $\Phi RDG$.

According to one embodiment of the present invention, read diffusion region 110 and floating diffusion region 120 are electrically connected to each other by a conductive line. The conductive line maintains read diffusion region 110 and floating diffusion region 120 at the same electrical potential. Read diffusion region 110 and floating diffusion region 120 are also electrically connected to a gate terminal of a source follower transistor.

Finally, a light shielding plate 400 with an opening exposing photodiode region is formed over gates 210, 220, 230, and 240.

FIGS. 4 through 9 are diagrams illustrating operations of the pixel sensor according to various embodiments of the present invention. In FIGS. 4 through 9, electrical potential levels are illustrated by changes in elevation within the drawings. For example, regions of the pixel sensor having lower electrical potential are illustrated at lower elevations in the drawing. These changes in elevation should not be taken to indicate changes in the shape of the pixel sensor or paths taken by electrons through the pixel sensor.

Figure 4:
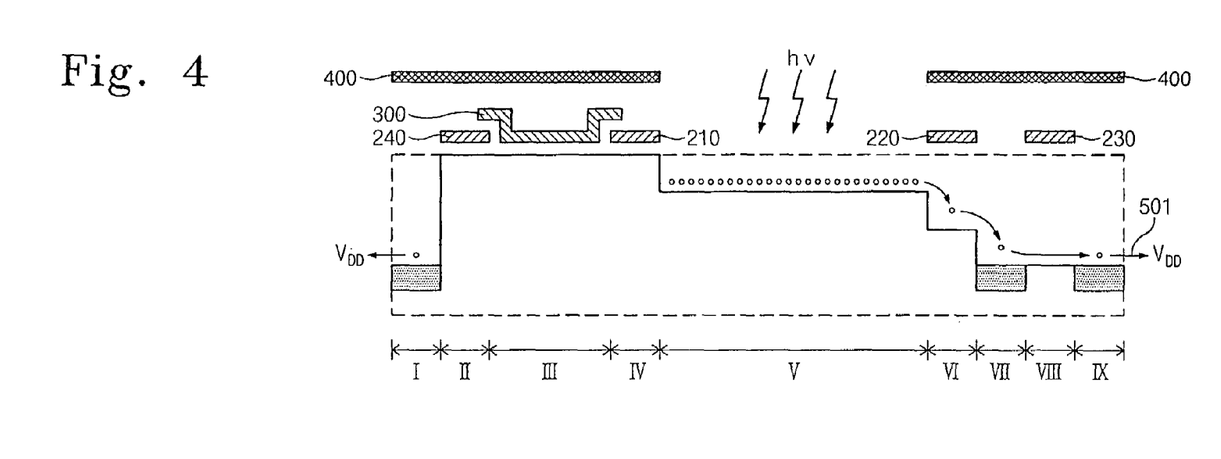
FIG. 4 is a diagram illustrating a reset operation of a CMOS image sensor according to an embodiment of the present invention.

FIG. 4 is a diagram illustrating a reset operation of the pixel sensor. The reset operation removes electrical charges remaining in photodiode region PD, read diffusion region 110, and floating diffusion region 120 following a previous frame.

Referring to FIG. 4, electrical charges are removed from photodiode region PD, read diffusion 110 and floating diffusion region 120 by applying a reset voltage to reset gate 230 and a second transfer voltage to second transfer gate 220.

The reset voltage causes the reset channel to open in order to electrically connect floating diffusion region 120 with reset diffusion region 130. The second transfer voltage causes a second transfer channel between floating diffusion region 120 and photodiode region PD to open. Preferably, a potential level of the second transfer channel is higher than a potential level of the reset channel.

A read voltage may be optionally applied to read gate 240 during the reset operation to electrically connect read diffusion region 110 with storage diffusion region 140.

During the reset operation, photodiode region PD is electrically connected to floating diffusion region 120, floating diffusion region 120 is electrically connected to reset diffusion region 130, and reset diffusion region 130 is electrically connected to power source voltage VDD. Meanwhile, read diffusion region 110 maintains an equivalent potential with floating diffusion region 120. Accordingly, charges remaining in photodiode region PD, floating diffusion region 120, and read diffusion region 110 are removed (i.e., exhausted) through reset diffusion region 130.

Figure 5:
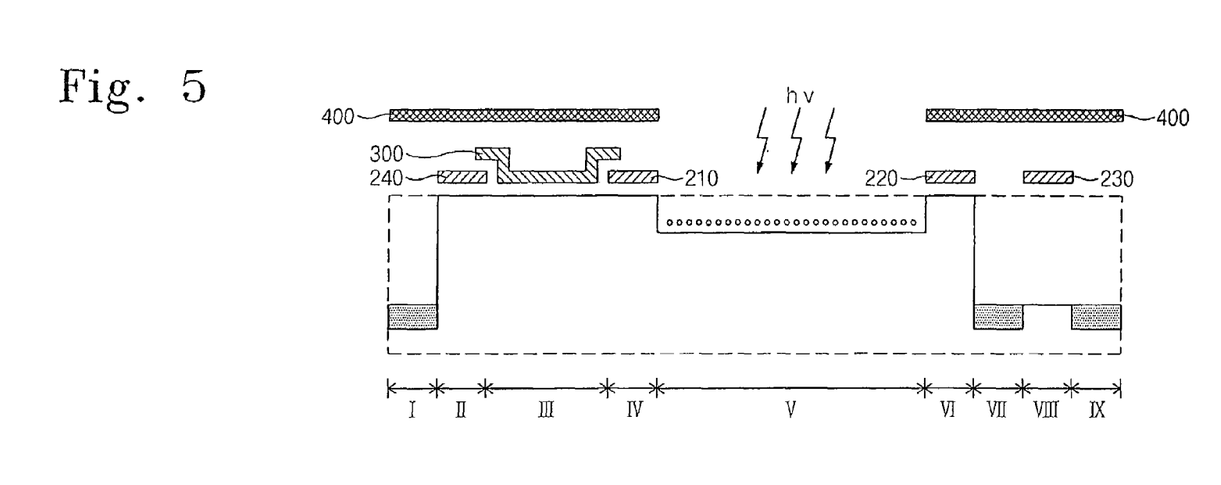
FIGS. 5 and 6 are diagrams illustrating an exposure operation of a CMOS image sensor according to an embodiment of the present invention.
Figure 6:
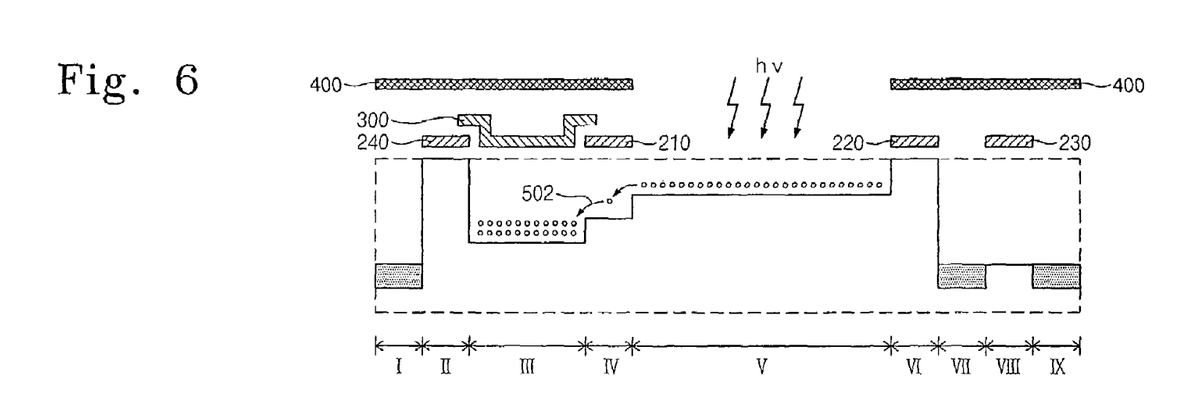

FIGS. 5 and 6 are diagrams illustrating an exposure operation of the CIS according to an embodiment of the present invention. In the exposure operation, incident light "hv" on photodiode PD generates electrical charges therein during a predetermined exposure time. The electrical charges are stored in storage diffusion region 140.

Referring to FIG. 5, first and second transfer interrupting voltages are applied to respective first and second transfer gates 210 and 220 in order to store the electrical charges in storage diffusion region 140.

Preferably, the first transfer interrupting voltage is lower than the first transfer voltage and the second transfer interrupting voltage is lower than the second transfer voltage.

A read interrupting voltage, which is lower than the read voltage, is connected to read gate 240. Consequently, electrical charges generated in photodiode region PD are confined or substantially confined within an electric potential well encompassed by a first transfer channel region IV and a second transfer channel region VI.

Referring to FIG. 6, a voltage higher than the first transfer voltage is applied to first transfer gate 210 to open a first transfer channel between photodiode region PD and storage diffusion region 140. At the same time, a storage voltage, which is higher than the first transfer voltage and the read voltage, is applied to upper capacitor electrode 300 to cause a potential level in storage diffusion region 140 to be lower than that of photodiode region PD and first transfer channel region IV.

Where storage diffusion region 140 has a lower potential level than photodiode region PD, electrical charges 502 generated in photodiode region PD are transferred to storage diffusion region 140 through the first transfer channel.

All pixel sensors within the CIS transfer electrical charges between photodiode region PD and storage diffusion region 140 at the same time. This prevents or substantially prevents the pixel sensors from producing distorted pixels due to a time delay occurring before the transfer of the electrical charges. In other words, it promotes uniform exposure of pixels under identical lighting conditions.

In one alternative embodiment of the invention, a voltage higher than the first transfer voltage is applied to first transfer gate 210 during the predetermined exposure time. Accordingly, electrical charges generated in photodiode region PD are transferred to storage diffusion region 140 without waiting for the predetermined exposure time to end.

Figure 7:
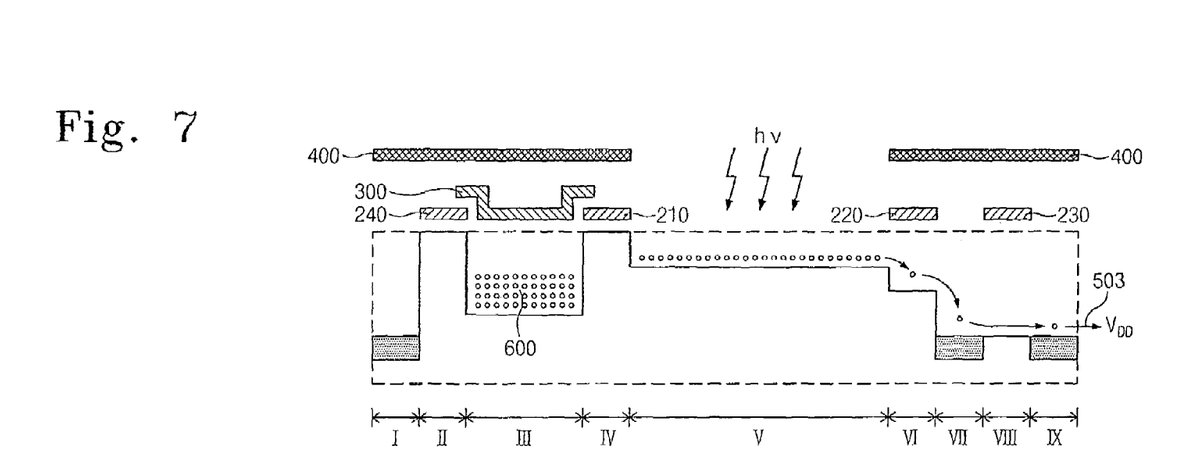
FIGS. 7 and 8 are diagrams illustrating read operations performed on respective deselected and selected pixel sensors of a CMOS image sensor according to embodiments of the present invention.
Figure 8:
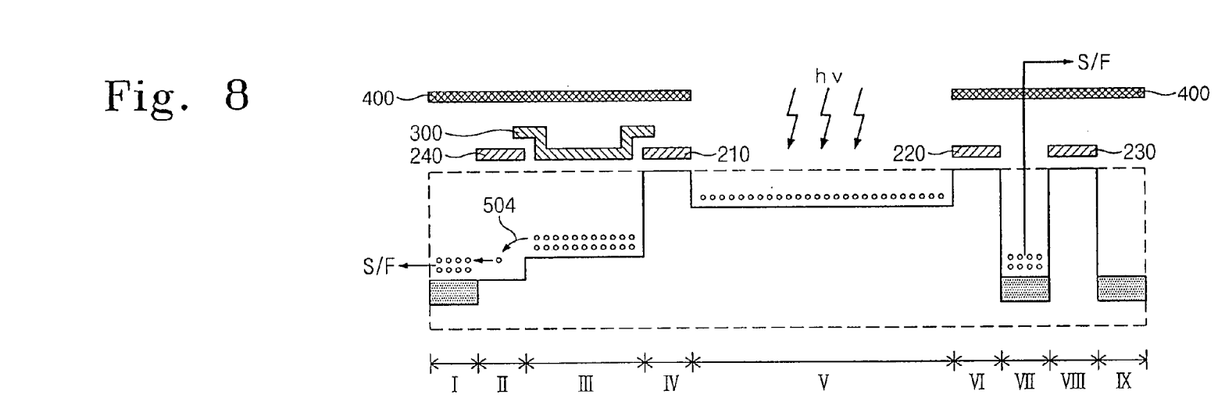

FIGS. 7 and 8 are diagrams illustrating a read operation of the CIS according to an embodiment of the present invention. In the read operation, an amount of electrical charges stored at storage diffusion region 140 is sensed.

The read operation is performed by each pixel sensor in the plurality of pixel sensors according to a predefined read sequence. The predefined read sequence specifies times during which each pixel sensor is selected and deselected. Where a pixel sensor is selected, an amount of electrical charges stored at storage diffusion region 140 is sensed. Where the pixel sensor is deselected, electrical charges generated in photodiode region PD are prevented or substantially prevented from migrating to storage diffusion region 140.

In order to inhibit electrical charges generated in photodiode region PD from migrating to storage diffusion region 140 in a deselected pixel sensor, a voltage lower than the first transfer voltage is applied to first transfer gate 210 while the pixel sensor is deselected. In addition, a voltage higher than the second transfer voltage is applied to second transfer gate 220 while the pixel sensor is deselected.

As a result, while a pixel sensor is deselected, charges in photodiode region PD are not transferred to storage diffusion region 140, but rather they are transferred to floating diffusion region 120 through the second transfer channel. At the same time, a voltage higher than the reset voltage is applied to reset gate 230. Accordingly, electrical charges 503 overflowing from photodiode region PD to floating diffusion region 120 are transferred to a power source generating power source voltage VDD through reset diffusion region 130. In other words, the overflowing electrical charges are "exhausted" from the pixel sensor. As a result, while a pixel sensor is deselected, voltage conditions applied to second transfer gate 220 and reset gate 230 are identical to those applied during the aforementioned reset operation.

Where the pixel sensor is deselected, a voltage lower than the read voltage is applied to read gate 240. Consequently, electrical charges 600 stored in storage diffusion region 140 are maintained therein.

Because overflowing charges are exhausted from the pixel sensor, image distortion caused by overflowing charges is substantially avoided in images produced by the CIS. In addition, by storing electrical charges generated during the exposure operation in storage diffusion region 140, white spots are prevented or substantially prevented from being generated in images formed by the CIS.

Where the pixel sensor is deselected, the reset voltage applied to reset gate 230 is preferably higher than the second transfer voltage.

Referring to FIG. 8, where the pixel sensor is selected, read gate 240 is supplied with a voltage higher than the read voltage. Consequently, the read channel is opened and read diffusion region 110 is electrically connected to storage diffusion region 140 through the read channel. As a result, electrical charges 504 accumulated in storage diffusion region 140 are transferred to read diffusion region 110 through the read channel.

At the same time, voltages lower than the first and second transfer voltages are applied to respective first and second transfer gates, 210 and 220. As a result, the first and second transfer channels are closed to prevent or substantially prevent electrical charges from being transferred from photodiode region PD to storage diffusion region 140 and floating diffusion region 120.

Where the pixel sensor is selected, reset gate 230 is supplied with a voltage lower than the reset voltage to close the reset channel, thereby electrically isolating floating diffusion region 120 from reset diffusion region 130. Because floating diffusion region 120 has the same electrical potential as read diffusion region 110, closing the reset channel causes floating diffusion region 120 and read diffusion region 110 to be disconnected from power source voltage VDD. As a result, the electrical potential of read diffusion region 110 and floating diffusion region 120 drive the gate of the source follower transistor.

A source of the source follower transistor is electrically connected to an output node of the pixel sensor. Accordingly, electrical charges transferred to read diffusion region 110 from storage diffusion region 140 cause variations in a voltage apparent at the output node.

Preferably, where the pixel sensor is selected, the storage voltage applied to upper capacitor electrode 300 is higher than the read voltage applied to read gate 240.

Figure 9:
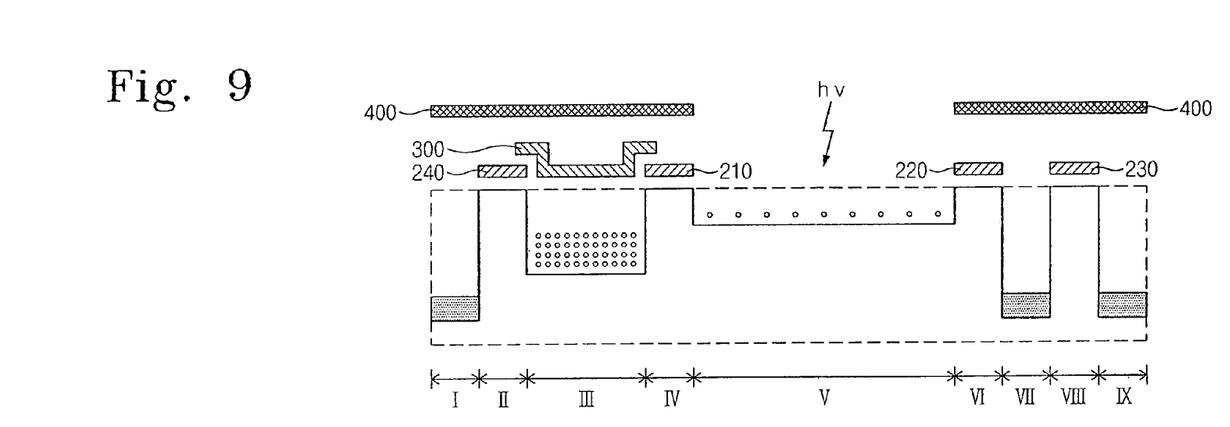
FIG. 9 is a diagram illustrating an operation of a CMOS image sensor in accordance with another embodiment of the present invention; and, FIGS. 10A through 10G are cross-sectional diagrams illustrating a method of fabricating a CMOS image sensor in accordance with an embodiment of the present invention.

FIG. 9 is a diagram illustrating an operation of a pixel sensor in a CIS according to another embodiment of the present invention.

Referring to FIG. 9, the intensity of incident light "hv" on photodiode region PD is insufficient to cause electrical charges to overflow into floating diffusion region 120 while the pixel sensor is deselected. Accordingly, there is no need to open the second transfer channel in order to transfer overflowing electrons to floating diffusion region 120. To maintain the second transfer channel closed, a voltage lower than the second transfer voltage is applied to second transfer gate 220.

FIGS. 10A through 10G are cross-sectional diagrams illustrating a method of fabricating the CIS according to one embodiment of the present invention.

Figure 10A:
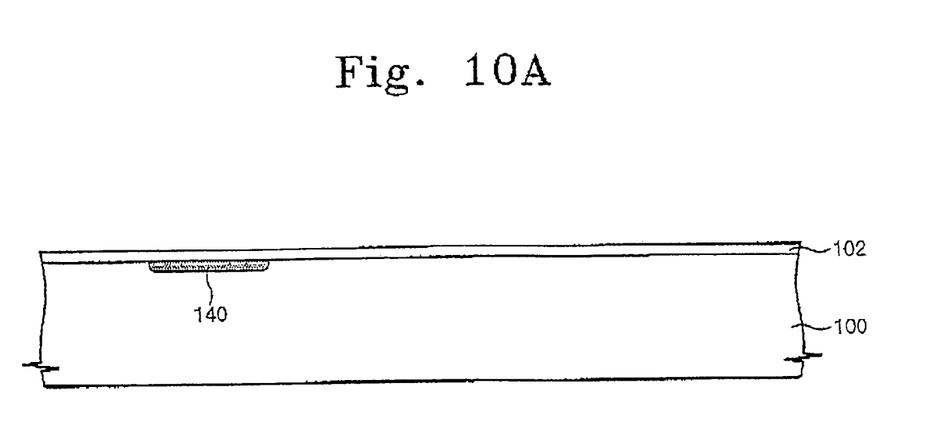

Referring to FIG. 10A, diffused wells are formed at predetermined locations in semiconductor substrate 100 using an ion implantation process. Field isolation film patterns (not shown) are then formed at predetermined locations of semiconductor substrate 100 to define active regions therein. Preferably, the field isolation film patterns are formed by a trench isolation technique.

A buffer insulation film 101 is formed on the active regions and storage diffusion region 140 is formed in one of the active regions using an ion implantation process. Storage diffusion region 140 is preferably formed to have a different conductivity type from semiconductor substrate 100. For instance, where semiconductor substrate 100 is a P-type, storage diffusion region 140 is preferably N-type.

Figure 10B:
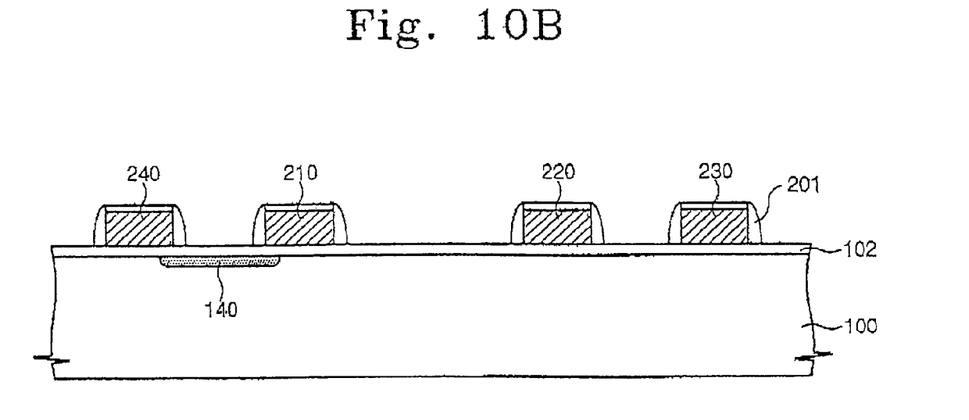

Referring to FIG. 10B, buffer insulation film 101 is removed from semiconductor substrate 100 and a gate insulation film 102 is deposited on the active regions. A gate conductive film and an insulating cover layer is deposited on gate insulation film 102 and then patterned to form first transfer gate 210, second transfer gate 220, reset gate 230, and read gate 240.

Read gate 240 and first transfer gate 210 are formed on opposite sides of storage diffusion region 140. Storage diffusion region 140 is formed in an active region between read gate 240 and first transfer gate 210.

As described in relation to FIG. 3, second transfer gate 220 is spaced apart from first transfer gate 210 and reset gate 230 is spaced apart from second transfer gate 220. Gates, 210, 220, 230, and 240, are preferably made of conductive materials such as polycrystalline silicon, tungsten silicide, tungsten, cobalt, and so forth. Gate spacers 201 are formed on sidewalls of gates 210, 220, 230, and 240.

Figure 10C:
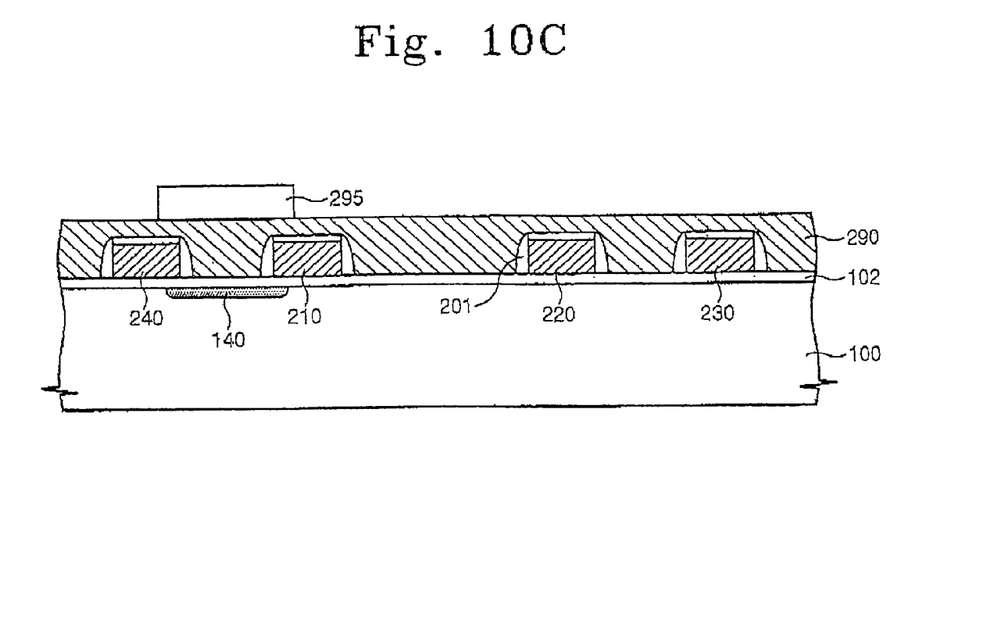
Figure 10D:
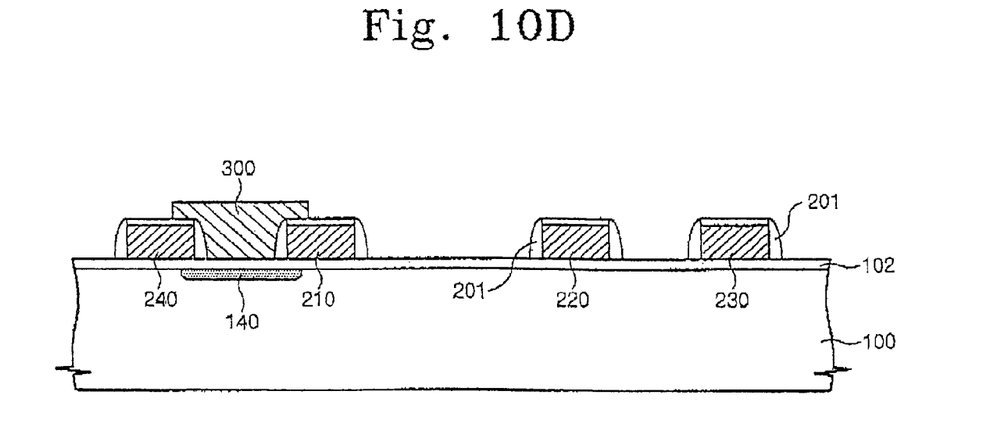

Referring to FIGS. 10C and 10D, an upper capacitor electrode film 290 covering gates 210, 220, 230, and 240 is deposited on semiconductor substrate 100. Upper capacitor electrode film 290 is typically formed of a conductive material containing polycrystalline silicon. Next, a first photomask 295 is formed on upper capacitor electrode film 290. First photomask 295 preferably covers storage diffusion region 140.

Upper capacitor electrode film 290 is patterned using first photomask 295 to create upper capacitor electrode 300 over storage diffusion region 140. Gate isolation film 102 is interposed between upper capacitor electrode 300 and storage diffusion region 140 and acts as a dielectric film of a MOS capacitor. After upper capacitor electrode film 290 is patterned, first photomask 295 is then removed.

Figure 10E:
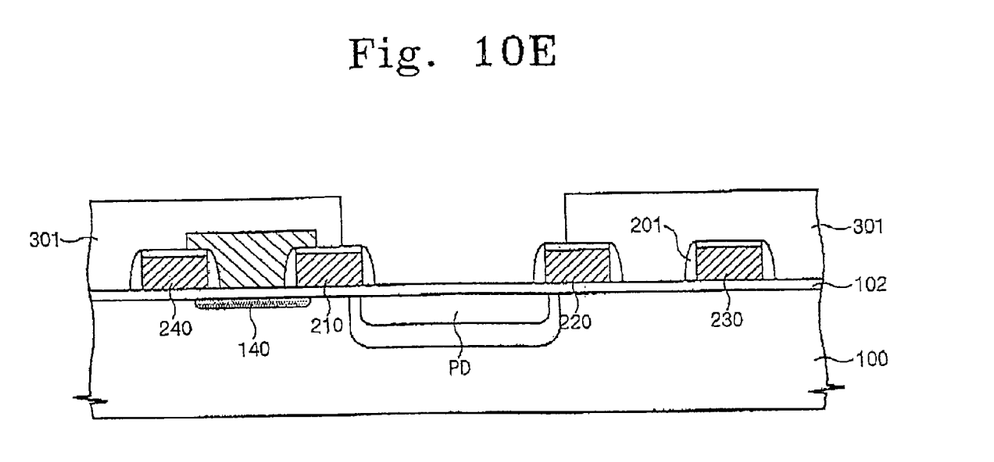

Referring to FIG. 10E, a second photomask 301 having an opening between first and second transfer gates 210 and 220 is formed on semiconductor substrate over gates 210, 220, 230, and 240 and upper capacitor electrode 300. Photodiode region PD is then formed in semiconductor substrate 100 between first and second transfer gates 210 and 220 using second photomask 301.

Photodiode region PD is formed by first and second ion implantation processes. The first and second ion implantation processes implant impurities into semiconductor substrate 100. The impurities used in the first ion implantation process have the same conductivity type as semiconductor substrate 100 and the impurities used in the second ion implantation process have a different conductivity type from semiconductor substrate 100.

Preferably, the first ion implantation process uses a slope ion implantation technique implanting arsenic (As) impurities, and the second ion implantation process uses $BF_2$ impurities. In order to form photodiode region PD as a PN junction, the arsenic (Ar) impurities are required to be diffused deeper into semiconductor substrate 100 than the $BF_2$ impurities.

Figure 10F:
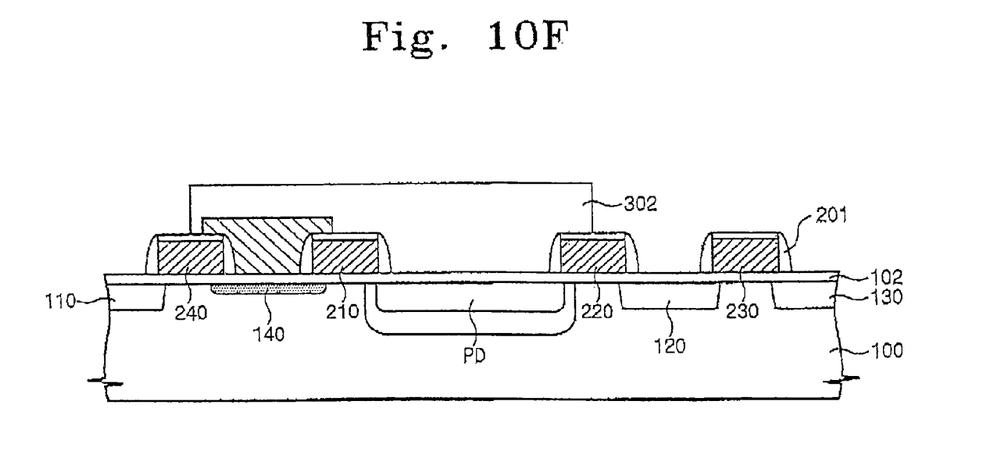

Referring to FIG. 10F, second photomask 301 is removed and a third photomask 302 is formed on semiconductor substrate 100. Third photomask 302 covers photodiode region PD, upper capacitor electrode 300, and gate 210 and extends to top portions of gates 220 and 240.

Once third photomask region 302 is formed, read diffusion region 110, floating diffusion region 120, and reset diffusion region 130 are formed using third photomask 302 as an ion implantation mask. Read diffusion region 110 is formed in an active region on one side of read gate 240, while floating diffusion region 120 is formed in an active region between second transfer gate 220 and reset gate 230. Reset diffusion region 130 is formed an active region on one side of reset gate 230.

Figure 10G:
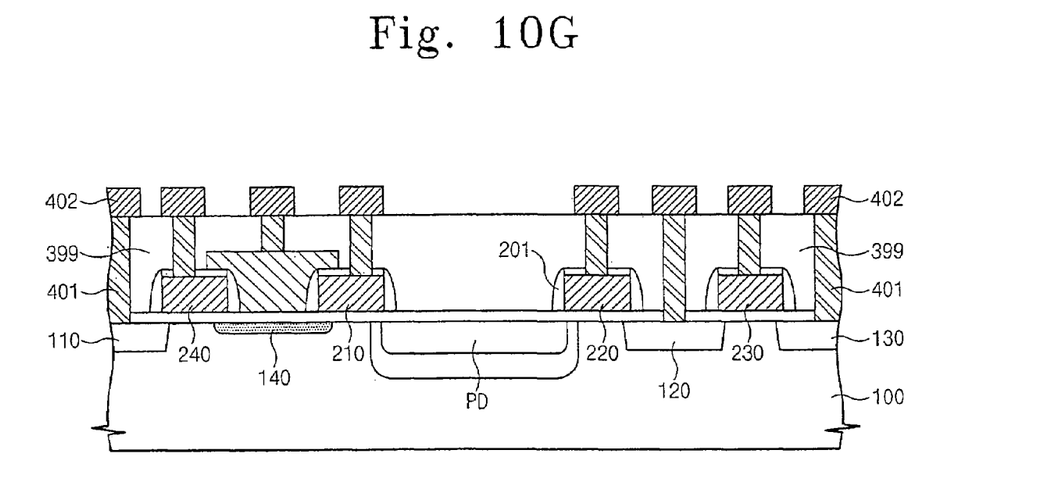

Referring to FIG. 10G, third photomask 302 is removed and then an interlevel insulation film 399 covering regions 110, 120, and 130, gates 210, 220, 230, and 240, photodiode region PD, and upper capacitor electrode 300 is formed on semiconductor substrate 100. Interlevel insulation film 399 is patterned to form contact holes partially exposing the gates, 210, 220, 230, and 240, and regions 110, 120, and 130. Contact plugs 401 are then formed to fill the contact holes and connection lines 402 are formed in contact with contact plugs 401.

According to selected embodiments of the present invention, a connection line connects read diffusion region 110 to floating diffusion region 120. The connection line may be formed by various methods (e.g., multilevel connection).

In a CIS formed according to embodiments of the present invention, a photodiode region is formed between a MOS capacitor storing electrical charges and a floating diffusion region through which overflowing electrical charges from the photodiode are transferred to a power source. By isolating the MOS capacitor from the floating diffusion region, electrical charges overflowing from the photodiode region are prevented or substantially prevented from accumulating in the MOS capacitor. Moreover, by storing electrical charges in the MOS capacitor, pixels of the CIS are uniformly exposed under identical lighting conditions.

The foregoing preferred embodiments are teaching examples. Those of ordinary skill in the art will understand that various changes in form and details may be made to the exemplary embodiments without departing from the scope of the present invention which is defined by the following claims.

What is claimed:

1. A complementary metal oxide semiconductor (CMOS) image sensor, comprising:
   a photodiode region formed in a semiconductor substrate;
   a storage diffusion region formed in the semiconductor substrate on one side of the photodiode region;
   a reset diffusion region formed in the semiconductor substrate on another side of the photodiode region;
   a read diffusion region formed in the semiconductor substrate on an opposite side of the storage diffusion region relative to the photodiode region; and,
   a floating diffusion region formed in the semiconductor substrate between the reset diffusion region and the photodiode region.

2. The CMOS image sensor of claim 1, further comprising a connection line electrically connecting the floating diffusion region to the read diffusion region.

3. The CMOS image sensor of claim 2, further comprising:
   an upper capacitor electrode formed over the storage diffusion region;
   a first transfer gate formed over the semiconductor substrate between the storage diffusion region and the photodiode region;
   a second transfer gate formed over the semiconductor substrate between the floating diffusion region and the photodiode region;
   a read gate formed over the semiconductor substrate between the read diffusion region and the storage diffusion region; and, a reset gate formed over the semiconductor substrate between the reset diffusion region and the floating diffusion region.

4. The CMOS image sensor of claim 3, further comprising:
a second transfer channel formed in the semiconductor substrate between the photodiode region and the floating diffusion region; and,
a reset channel formed in the semiconductor substrate between the reset diffusion region and the floating diffusion region;
wherein the second transfer channel opens in response to a second voltage applied to the second transfer gate and the reset channel opens in response to a reset voltage applied to the reset gate, causing electrical charges accumulated in the photodiode region, the floating diffusion region, and the read diffusion to be removed from the CMOS image sensor.

5. The CMOS image sensor of claim 4, wherein the reset voltage is higher than the second voltage.

6. The CMOS image sensor of claim 3, further comprising:
a first transfer channel formed in the semiconductor substrate between the photodiode region and the storage diffusion region;
wherein the first transfer channel opens in response to a first voltage applied to the first transfer gate to transfer electrical charges from the photodiode region to the storage diffusion region; and,
wherein an electric potential well is formed in the storage diffusion region in response to a storage voltage applied to the upper capacitor electrode.

7. The CMOS image sensor of claim 6, wherein the storage voltage is higher than the first voltage.

8. The CMOS image sensor of claim 3, further comprising:
a reset channel formed in the semiconductor substrate between the reset diffusion region and the floating diffusion region;
a first transfer channel formed in the semiconductor substrate between the photodiode region and the storage diffusion region;
a second transfer channel formed in the semiconductor substrate between the photodiode region and the floating diffusion region; and,
a read channel formed in the semiconductor substrate between the storage diffusion region and the reading diffusion region;
wherein the first transfer channel closes in response to a first voltage applied to the first transfer gate, the second transfer channel opens in response to a second voltage applied to the second transfer gate, the reset channel opens in response to a reset voltage applied to the reset gate, the read channel closes in response to a read voltage applied to the read gate, and an electric potential well is formed in the storage diffusion region in response to a storage voltage applied to the upper capacitor electrode, causing a discharge of overflowing charges via an electric path consisting of the second transfer channel, the floating diffusion region, the reset channel and the reset diffusion region, without transferring into the storage diffusion region.

9. The CMOS image sensor of claim 8, wherein the storage voltage is higher than the first and read voltages.

10. The CMOS image sensor of claim 3, further comprising:
a read channel formed in the semiconductor substrate between the storage diffusion region and the read diffusion region;
wherein the read channel opens in response to a read voltage applied to the read gate, and an electric potential well is formed in the storage diffusion region in response to a storage voltage applied to the upper capacitor electrode, thereby transferring charges stored in the storage diffusion region into the read diffusion region.

11. The CMOS image sensor of claim 10, further comprising:
a first transfer channel formed in the semiconductor substrate between the photodiode region and the storage diffusion region;
wherein the first transfer channel closes in response to a first voltage applied to the first transfer gate, thereby preventing electric charges generated in the photodiode region from transferring into the storage diffusion region.

12. The CMOS image sensor of claim 11, wherein the storage voltage is higher than the first voltage and lower than the read voltage.

13. The CMOS image sensor of claim 10, further comprising:
a reset channel formed in the semiconductor substrate between the floating diffusion region and the reset diffusion region;
wherein the reset channel closes in response to a reset voltage applied to the reset gate, thereby electrically isolating the floating diffusion region and the read diffusion region from the reset diffusion region.

14. The CMOS image sensor of claim 10, further comprising:
a first transfer channel formed in the semiconductor substrate between the photodiode region and the storage diffusion region; and,
a second transfer channel formed in the semiconductor substrate between the photodiode region and the floating diffusion region;
wherein the first transfer channel closes in response to a first voltage applied to the first transfer gate to prevent electrical charges generated in the photodiode region from transferring into the storage diffusion region; and,
wherein the second transfer channel closes in response to a second voltage applied to the second transfer gate to prevent electrical charges generated in the photodiode region from transferring into the floating diffusion region.

15. A complementary metal oxide semiconductor (CMOS) image sensor, comprising:
a photodiode region formed in a semiconductor substrate;
a storage diffusion region formed in the semiconductor substrate on a first side of the photodiode region;
a floating diffusion region formed in the semiconductor substrate on a second side of the photodiode region;
a read diffusion region formed in the semiconductor substrate on an opposite side of the storage diffusion region relative to the photodiode region;
a reset diffusion region formed in the semiconductor substrate on an opposite side of the floating diffusion region relative to the photodiode region;
an upper capacitor electrode formed over the storage diffusion region;

a first transfer gate formed over the semiconductor substrate between the storage diffusion region and the photodiode region;

a second transfer gate formed over the semiconductor substrate between the floating diffusion region and the photodiode region;

a read gate formed over the semiconductor substrate between the read diffusion region and the storage diffusion region; and, a reset gate formed over the semiconductor substrate between the reset diffusion region and the floating diffusion region.

16. The CMOS image sensor of claim 15, further comprising a connection line connecting the floating diffusion region to the read diffusion region.

17. The CMOS image sensor of claim 16, further comprising a sensing circuit connected to the connection line.

* * * * *